(12) United States Patent
Heidari et al.

(10) Patent No.: US 8,147,235 B2
(45) Date of Patent: *Apr. 3, 2012

(54) DEVICE AND METHOD FOR LARGE AREA LITHOGRAPHY

(75) Inventors: Babak Heidari, Furulund (SE); Marc Beck, Lund (DE); Helena Eleonora Benedihta Riddargrip Beck, legal representative, Eslöv (SE)

(73) Assignee: Obducat AB, Malmo (SE)

( * ) Notice: Subject to any disclaimer, the term of this patent is extended or adjusted under 35 U.S.C. 154(b) by 1115 days.

This patent is subject to a terminal disclaimer.

(21) Appl. No.: 10/581,497

(22) PCT Filed: Nov. 3, 2004

(86) PCT No.: PCT/EP2004/052769
§ 371 (c)(1),
(2), (4) Date: Jun. 2, 2006

(87) PCT Pub. No.: WO2005/054948
PCT Pub. Date: Jun. 16, 2005

(65) Prior Publication Data
US 2007/0018362 A1    Jan. 25, 2007

Related U.S. Application Data

(60) Provisional application No. 60/481,752, filed on Dec. 8, 2003.

(30) Foreign Application Priority Data

Dec. 5, 2003 (EP) ..................................... 03445141

(51) Int. Cl.
*A01J 21/00* (2006.01)
(52) U.S. Cl. ...................... 425/389; 425/174.4; 425/385
(58) Field of Classification Search ............... 425/174.4, 425/385, 389
See application file for complete search history.

(56) References Cited

U.S. PATENT DOCUMENTS 4,054,383 A    10/1977    Lin et al.
(Continued)

FOREIGN PATENT DOCUMENTS

CN    1478642 A    3/2004
(Continued)

OTHER PUBLICATIONS

M. Colburn et al., "Step and Flash Imprint Lithography: A New Approach to High-Resolution Patterning," *Proceedings of the Spie*, vol. 3676, Mar. 15, 1999, pp. 379-389, XP008011830.

(Continued)

*Primary Examiner* — Joseph Del Sole
*Assistant Examiner* — David N Brown, II
(74) *Attorney, Agent, or Firm* — Renner, Otto, Boiselle & Sklar, LLP (57) ABSTRACT

Apparatus and method for transferring a pattern from a template (10) having a structured surface to a substrate (12) carrying a surface layer of a radiation polymerisable fluid (14). The apparatus comprises a first main part (101) and a second main part (102) having opposing surfaces (104; 105), means for adjusting a spacing (115) between said main parts, support means (106) for supporting said template and substrate in mutual parallel engagement in said spacing with said structured surface facing said surface layer, a radiation source (110) devised to emit radiation into said spacing. A cavity (115) has a first wall comprising a flexible membrane (113) devised to engage said template or substrate, and means (114; 116) are provided for applying an adjustable overpressure to a medium present in said cavity, whereby an even distribution of force is obtained over the whole of the contact surface between the substrate and the template.

22 Claims, 6 Drawing Sheets

U.S. PATENT DOCUMENTS

| | | | | |
|---|---|---|---|---|
| 4,095,113 | A | * | 6/1978 | Wolff .................... 250/494.1 |
| 4,233,261 | A | * | 11/1980 | Mijnheer .................. 264/293 |
| 4,312,823 | A | * | 1/1982 | Kraakman et al. ............ 264/107 |
| 4,360,266 | A | | 11/1982 | Takeuchi |
| 4,844,947 | A | | 7/1989 | Kasner et al. |
| 5,804,017 | A | | 9/1998 | Hector |
| 5,947,027 | A | | 9/1999 | Burgin et al. |
| 6,027,630 | A | | 2/2000 | Cohen |
| 6,190,929 | B1 | | 2/2001 | Wang et al. |
| 6,284,345 | B1 | | 9/2001 | Ruoff |
| 6,334,960 | B1 | * | 1/2002 | Willson et al. ............... 216/52 |
| 6,387,778 | B1 | | 5/2002 | Bonin et al. |
| 6,387,787 | B1 | | 5/2002 | Mancini et al. |
| 6,482,742 | B1 | * | 11/2002 | Chou ....................... 438/690 |
| 6,743,740 | B2 | | 6/2004 | Brask |
| 6,949,199 | B1 | | 9/2005 | Gauzner et al. |
| 7,144,539 | B2 | | 12/2006 | Olsson |
| 7,374,864 | B2 | | 5/2008 | Guo et al. |
| 2003/0071016 | A1 | | 4/2003 | Shih et al. |
| 2003/0159608 | A1 | * | 8/2003 | Heidari ..................... 101/494 |
| 2003/0189273 | A1 | | 10/2003 | Olsson |
| 2004/0021254 | A1 | | 2/2004 | Sreenivasan et al. |
| 2004/0079730 | A1 | | 4/2004 | Ahrens et al. |
| 2004/0110856 | A1 | | 6/2004 | Young et al. |
| 2004/0131718 | A1 | * | 7/2004 | Chou et al. ................. 425/385 |
| 2005/0158419 | A1 | | 7/2005 | Watts et al. |
| 2005/0202350 | A1 | | 9/2005 | Colburn et al. |

FOREIGN PATENT DOCUMENTS

| | | |
|---|---|---|
| DE | 36 43817 | 6/1988 |
| DE | 36 43817 A1 | 6/1988 |
| JP | 2-289311 | 11/1990 |
| JP | 2-289311 A | 11/1990 |
| JP | 02289311 | 11/1990 |
| JP | 11191240 | 7/1999 |
| JP | 2000-194142 | 7/2000 |
| JP | 2003-077867 | 3/2003 |
| JP | 2003-77867 | 3/2003 |
| JP | 2003-77867 A | 3/2003 |
| JP | 2003-516644 | 5/2003 |
| JP | 2003-272998 | 9/2003 |
| WO | WO 01/33300 A2 | 5/2001 |
| WO | WO 01/42858 A1 | 6/2001 |
| WO | 02/07199 | 1/2002 |
| WO | WO 02/07199 A1 | 1/2002 |
| WO | WO 02/067055 A2 | 8/2002 |
| WO | WO 03/005124 A1 | 1/2003 |
| WO | 03/073164 | 9/2003 |

OTHER PUBLICATIONS

Heidari et al.; "Large Scale Nanolithography Using Nanoimprint Lithography"; Journal of Vacuum Science & Technology B, vol. 17, No. 6, pp. 2961-2964, (1999).

Resnick et al.; "Imprint Lithography for Integrated Circuit Fabrication"; Journal of Vacuum Science & Technology B, vol. 21, No. 6, pp. 2624-2631, (2003).

English language version of "Notification of the First Office Action" in corresponding Chinese App. No. 200510081756.4, Notification Date Jun. 6, 2008.

English language version of "Notification of the Second Office Action" in corresponding Chinese App. No. 200510081756.4, Notification Date Oct. 7, 2009.

Wissen et al., "UV Curing of Resists for Warm Embossing", Elsevier B.V., Microelectronic Engineering, vol. 73-74, pp. 184-187, (2004).

Reano et al., "Stability of Functional Polymers After Plasticizer-Assisted Imprint Lithography", Journal of Vaccum Science & Technology, American Vacuum Society, vol. 22, No. 6, pp. 3294-3299, (2004).

Bender et al., "Fabrication of Nanostructures Using a UV-Based Imprint Technique", Elsevier B.V., Microelectronic Engineering, vol. 53, pp. 233-236, (2000).

Office Action in U.S. Appl. No. 11/579,540, Date May 13, 2009 (19 pages).

Office Action in U.S. Appl. No. 11/123,087, Date Feb. 3, 2009 (11 pages).

Office Action in U.S. Appl. No. 11/123,087, Date Jun. 27, 2008 (8 pages).

Office Action in U.S. Appl. No. 11/123,087, Date Oct. 10, 2007 (9 pages).

Office Action in corresponding U.S. Appl. No. 11/579,540 mailed Dec. 10, 2009 (19 pages).

Pfeiffer et al.; Multistep profiles by mix and match of nanoimprint and UV lithography, Microelectronic Engineering, vol. 57-58 (2001), pp. 381-387.

Office Action in corresponding U.S. Appl. No. 11/905,036 mailed Dec. 29, 2009 (16 pages).

Office Action in corresponding Japanese Patent Application No. 2005-136511 mailed Jul. 30, 2010 and English translation.

Official Action from corresponding European Application No. 04 445 057.5 dated Oct. 25, 2010.

* cited by examiner

DEVICE AND METHOD FOR LARGE AREA LITHOGRAPHY

CROSS REFERENCE TO RELATED APPLICATIONS

This application is an national phase application based on PCT/EP2004/052769, filed Nov. 3, 2004, which claims the benefit of U.S. Provisional Application No. 60/481,752, filed Dec. 8, 2003, and claims the right to priority based on European Application No. 03445141.9, filed Dec. 5, 2003, the content of each of which is incorporated herein by reference in its entirety.

FIELD OF THE INVENTION

The invention relates to a device in connection with the lithography of structures on a micro or nanometer scale. In particular, the invention relates to imprint lithography on large area substrates or objects.

BACKGROUND

The trend in microelectronics, as well as in micromechanics, is towards ever smaller dimensions. Some of the most interesting techniques for fabrication of micro and submicro structures include different types of lithography.

Photolithography typically involves the steps of coating a substrate with a photoresist material to form a resist layer on a surface of the substrate. The resist layer is then exposed to radiation at selective portions, preferably by using a mask. Subsequent developing steps remove portions of the resist, thereby forming a pattern in the resist corresponding to the mask. The removal of resist portions exposes the substrate surface, which may be processed by e.g. etching, doping, or metallisation. For fine scale replication, photolithography is limited by diffraction, which is dependent on the wavelength of the radiation used. For fabrication of structures on a scale of less than 50 nm, such a short wavelength is needed that the material requirements on the optical systems will be major.

An alternative technique is imprint technology. In an imprint lithography process, a substrate to be patterned is covered by a mouldable layer. A pattern to be transferred to the substrate is predefined in three dimensions on a stamp or template. The stamp is brought into contact with the mouldable layer, and the layer is softened, preferably by heating. The stamp is then pressed into the softened layer, thereby making an imprint of the stamp pattern in the mouldable layer. The layer is cooled down until it hardens to a satisfactory degree followed by detachment and removal of the stamp. Subsequent etching may be employed to replicate the stamp pattern in the substrate. The steps of heating and cooling the combined stamp and substrate can bring about movement in the engaging surfaces due to heat expansion. The larger the area to be imprinted, the larger the actual expansion and contraction, which can make the imprint process more difficult for larger surface areas.

A different form of imprint technology, generally known as step and flash imprint lithography has been proposed by Willson et al. in U.S. Pat. No. 6,334,960, and also by Mancini et al in U.S. Pat. No. 6,387,787. Similar to the imprint technique briefly described above, this technique involves a template having a structured surface defining a pattern to be transferred to a substrate. The substrate is covered by a layer of polymerisable fluid, into which layer the template is pressed such that the fluid fills recesses in the pattern structure. The template is made from a material which is transparent to a radiation wavelength range which is usable for polymerising the polymerisable fluid, typically UV light. By applying radiation to the fluid through the template, the fluid is solidified. The template is subsequently removed, after which the pattern thereof is replicated in the solid polymer material layer made from the polymerised fluid. Further processing transfers the structure in the solid polymer material layer to the substrate.

WO 02/067055 to Board of Regents, the University of Texas System, discloses a system for applying step and flash imprint lithography. Among other things, this document relates to production-scale implementation of a step and flash apparatus, also called a stepper. The template used in such an apparatus has a rigid body of transparent material, typically quartz. The template is supported in the stepper by flexure members, which allow the template to pivot about both X and Y axes, which are mutually perpendicular in a plane parallel to the substrate surface to be imprinted. This mechanism also involves a piezo actuator for controlling parallelism and the gap between the template and the substrate. Such a system is, however, not capable of handling large area substrate surfaces in a single imprint step. A step and flash system offered on the market is the IMPRIO 100, provided by Molecular Imprints, Inc, 1807-C West Braker Lane, Austin, Tex. 78758, U.S.A. This system has a template image area of 25×25 mm, and a street width of 0.1 mm. Although this system is capable of handling substrate wafers of up to 8 inches, the imprint process has to be repeated by lifting the template, moving it sideways, and lowering it to the substrate again, by means of an X-Y translation stage. Furthermore, for each such step, renewed alignment as well as new deposition of polymerisable fluid has to be performed. This technique is therefore very time-consuming, and less than optimum for large scale production. Furthermore, besides problems of repeated alignment errors, and high accuracy demands on the translation stage, this technique suffers from the drawback that continuous structures which are larger than said template size cannot be produced. All in all, this means the productions costs may be too high to make this technique interesting for large scale production of fine structure devices.

SUMMARY OF THE INVENTION

Accordingly, an object of the present invention is to provide methods and means for improving fabrication of structures comprising three-dimensional features on a micro or nanometer scale. In particular, it is an object to provide improved methods and means for transferring a pattern of such structures to substrates having widths of more than one inch, and even for 8 inch diameters, 12 diameters inch, and larger.

According to a first aspect, this object is fulfilled by an apparatus for transferring a pattern from a template having a structured surface to a substrate carrying a surface layer of a radiation polymerisable fluid, said apparatus comprising a first main part and a second main part having opposing surfaces, means for adjusting a spacing between said main parts, support means for supporting said template and substrate in mutual parallel engagement in said spacing with said structured surface facing said surface layer, a radiation source devised to emit radiation into said spacing, a cavity having a first wall comprising a flexible membrane devised to engage said template or substrate, and means for applying an adjustable overpressure to a medium present in said cavity. Due to the flexible membrane, an absolutely even distribution of force is obtained over the whole of the contact surface between the substrate and the template, whereby patterning of large area substrates in a single imprint step is made possible.

Preferably, said medium comprises a gas or a liquid.

In one embodiment, said medium comprises air.

In one embodiment, said means for applying an adjustable overpressure is arranged to adjust the pressure to 1-500 bar.

Preferably, said cavity is defined by a part of the surface of said first main part, a flexible seal member arranged in and protruding from said first main part surface, and said membrane which engages said seal member.

In a preferred embodiment, said membrane is disconnectable from said seal member, and devised to engage said seal member by application of pressure from said second main part.

Preferably, said membrane is transparent to a wavelength range of said radiation, said radiation source being positioned behind said membrane.

In one embodiment, said membrane and at least a portion of said surface of said first main part is transparent to a wavelength range of said radiation, said radiation source being positioned behind said portion of said surface of said first main part.

In a preferred embodiment, said portion of said surface of said first main part is made from quartz, calcium fluoride or any other pressure stable material being transparent to said radiation.

Preferably, said radiation source is devised to emit radiation at least in a wavelength range of 100-500 nm.

In a preferred embodiment, said radiation source is air-cooled and devised to emit pulsating radiation with a pulse duration of 0.5-10 µs and a pulse rate of 1-10 pulses per second.

In one embodiment, said membrane consists of a polymer material.

In a preferred embodiment, said membrane has a diameter or width of 50-1000 mm.

In one embodiment, said substrate acts as said membrane.

According to a second aspect, the object of the present invention is fulfilled by a method for transferring a pattern from a template having a structured surface to a substrate carrying a surface layer of a radiation polymerisable fluid, comprising the steps of:

arranging said template and substrate mutually parallel with said structured surface facing said surface layer, between a stop member and a first side of a flexible membrane;

applying an overpressure to a medium present on a second side of the membrane, opposite to said first side, for imprinting said pattern into said layer; and exposing said layer to radiation for solidifying said layer.

Preferably, said medium comprises a gas or a liquid.

In one embodiment, said medium comprises air.

Preferably, the method comprises the step of:

placing said membrane in direct engagement with said template or said substrate.

In a preferred embodiment, the method comprises the step of:

clamping said membrane at a peripheral portion thereof between said stop member and a seal member, thereby defining a peripheral wall for a cavity for said medium.

Preferably, the method comprises the step of:

emitting radiation to said layer through said template or/and through said substrate, which template or/and substrate is/are transparent to a wavelength range of a radiation usable for polymerising said fluid.

In a preferred embodiment, the method comprises the step of:

emitting radiation to said layer through said membrane, which membrane is transparent to a wavelength range of a radiation usable for polymerising said fluid.

Preferably, the method comprises the step of:

emitting radiation to said layer through said membrane, and through a transparent wall opposing said membrane, defining a back wall for a cavity for said medium, which back wall and membrane are transparent to a wavelength range of a radiation usable for polymerising said fluid.

In one embodiment, the step of exposing said layer comprises the step of:

emitting radiation from a radiation source within a wavelength range of 100-500 nm.

In a preferred embodiment, the method comprises the steps of:

air-cooling said radiation source, and emitting pulsating radiation with a pulse duration in the range of 0.5-10 µs and a pulse rate in the range of 1-10 pulses per second.

In one embodiment, the method comprises the step of:

using said substrate as said membrane.

In another embodiment, the method comprises the step of:

clamping said substrate and template together prior to arranging said template and substrate between said stop member and said flexible membrane.

In yet another embodiment, the method comprises the step of:

applying a vacuum between said template and said substrate in order to extract air inclusions from said surface layer prior to exposing said layer to radiation.

BRIEF DESCRIPTION OF THE DRAWINGS

The invention will be described in greater detail below with reference to the accompanying drawings, on which.

DETAILED DESCRIPTION OF PREFERRED EMBODIMENTS

The present invention relates, in general, to a method of transferring a pattern from a template to a substrate, by creating a relief image of a structure on a surface of the template on a surface of the substrate. The surface of the template and the surface of the substrate are in this process arranged generally parallel to each other, and the transfer of the pattern is obtained by pressing the structured template surface into a formable layer disposed on the substrate surface. The formable layer is treated to solidify, such that its shape is forced to resemble the template surface. The template can thereafter be removed from the substrate and its layer, said layer now being an inverted topographical replica of the template. In order to permanent the transferred pattern in the substrate, further processing may be required. Typically, wet or dry etching is performed to selectively etch the surface of the substrate under the solidified layer, whereby the pattern in the solidified layer is transferred to the substrate surface. This much is state of the art, and is well described in prior art documents, such as the aforementioned U.S. Pat. No. 6,334,960.

Figure 1:
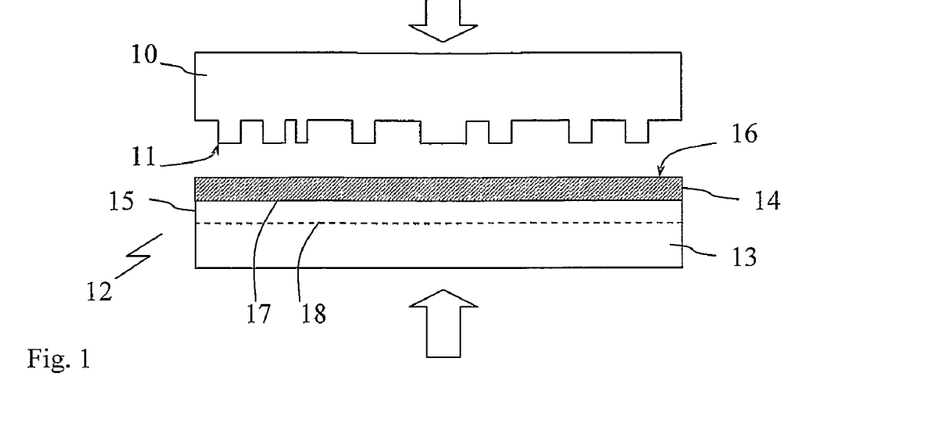
FIGS. 1-3 schematically illustrate the main process steps for transferring a pattern from a template to a substrate, wherein radiation is applied through a transparent template to solidify a polymerisable fluid on the substrate surface.
Figure 2:
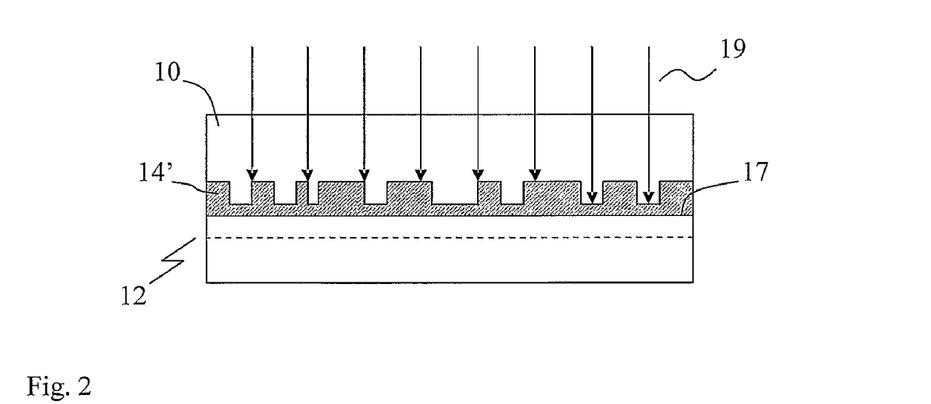
Figure 3:
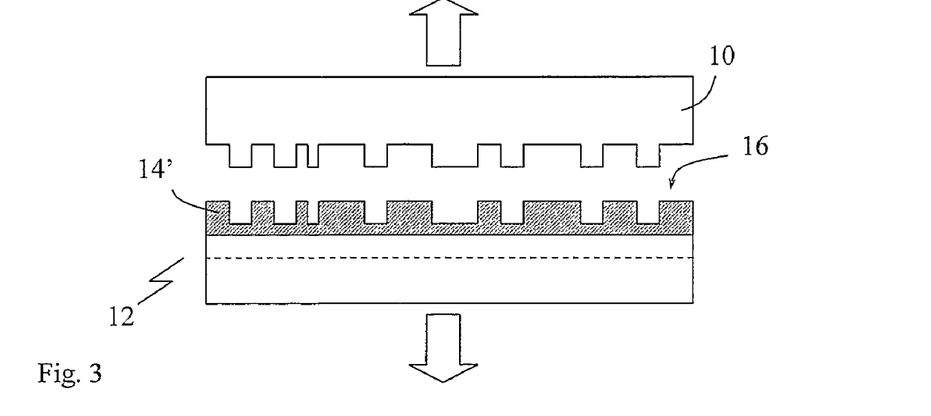

FIGS. 1-3 schematically present the basic process steps of the actual pattern transfer steps, or imprint steps, of an embodiment of the invention.

In FIG. 1 a template 10 is illustrated, the template having a structured surface 11, in which three-dimensional protrusions and recesses are formed with a feature size in height and width within a range of 1 nm to several μm, and potentially both smaller and larger. The thickness of template 10 is typically between 10 and 1000 μm. A substrate 12 has a surface 17 which is arranged substantially parallel to template surface 11, with an intermediate spacing between the surfaces at the initial stage shown in FIG. 1. The substrate 12 comprises a substrate base 13, to which the pattern of template surface 11 is to be transferred. Though not shown, the substrate may also include a support layer below the substrate base 13. In a process where the pattern of template 10 is to be transferred to substrate 12 directly through an imprint in a polymerisable fluid, said fluid may be applied as a surface layer 14 directly onto the substrate base surface 17. In alternative embodiments, indicated by the dashed line, a transfer layer 15 is also employed, of e.g. a polymer. Examples of such, and how they are used in the subsequent process of transferring the imprinted pattern to the substrate base 13, are also described in U.S. Pat. No. 6,334,960. In an embodiment including a transfer layer 15, substrate surface 17 denotes the upper or outer surface of the transfer layer 15, which in turn is arranged on the substrate base surface 18.

Examples of available and usable polymerisable or curable fluids for layer 14 comprise NIP-K17 and NIP-K22 from ZEN Photonics, 104-11 Moonj i-Dong, Yusong-Gu, Daejeon 305-308, South Korea. NIP-K17 has a main component of acrylate, and has a viscosity at 25° C. of about 9.63 cps. NIP-K22 also has a main component of acrylate, and a viscosity at 25° C. of about 5.85 cps. Both substances are devised to cure under exposure to ultraviolet radiation above 12 mW/cm$^2$ for 2 minutes.

Another example of an available and usable polymerisable fluid for layer 14 is Ormocore from Micro Resist Technology GmbH, Koepenicker Strasse 325, Haus 211, D-12555 Berlin, Germany. This substance has a composition of inorganic-organic hybrid polymer, unsaturated, with a 1-3% photopolymerisation initiator. Viscosity is 3-8 mPas at 25° C., and the fluid may be cured under exposure of radiation with 500 mJ/cm$^2$ at a wavelength of 365 nm. Other examples of polymerisable materials are mentioned in U.S. Pat. No. 6,334,960.

The thickness of layer 14 when deposited on the substrate surface is typically 10 nm-10 μm, depending on application area. The polymerisable fluid may be applied by spin coating, roller coating, dip coating or similar. A typical advantage with the present invention, compared to the prior art step and flash method, is that the polymer fluid may be spin coated on the entire substrate, which is an advantageous and fast process. The step and flash method, on the other hand, has to use repeated dispensation by dripping on repeated surface portions, since that method is incapable of handling large surfaces in single steps.

The arrows of FIG. 1 illustrate that the template surface 11 is pressed into surface 16 of the polymerisable fluid layer 14.

FIG. 2 illustrates how the structures of template surface 11 has made an imprint in the fluid layer 14, at which the fluid has been forced to fill the recesses in template surface 11. In the illustrated embodiment, the highest protrusions in template surface 11 do not penetrate all the way down to substrate surface 17. This may be beneficial for protecting the substrate surface 17, and particularly the template surface 11, from damage. However, in alternative embodiments, such as one including a transfer layer, imprint may be performed all the way down to transfer layer surface 17. In the embodiment illustrated in FIGS. 1-3, the template is made from a material which is transparent to radiation 19 of a predetermined wavelength or wavelength range, which is usable for solidifying a selected polymerisable fluid. Such materials may e.g. be quartz or various forms of polymers, dependent on the radiation wavelength. Radiation 19 is typically applied when template 10 has been pressed into fluid layer 14 with a suitable alignment between template 10 and substrate 12. When exposed to this radiation 19, the polymerisable fluid is polymerised and solidified to a solid body 14', to take the shape determined by the template 10.

The template 10 is thereafter removed, e.g. by a peeling and pulling process. The formed and solidified polymer layer 14' remains on the substrate 12. The various different ways of further processing of the substrate and its layer 14' will not be dealt with here in any detail, since the invention as such is neither related to such further processing, nor is it dependent on how such further processing is achieved.

Figure 4:
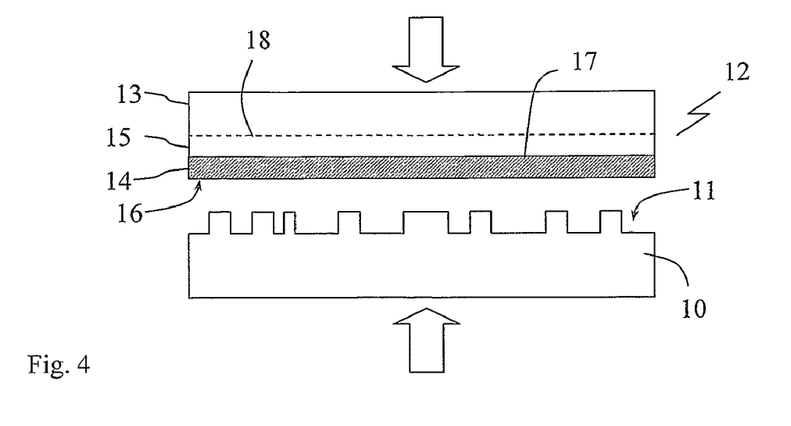
FIGS. 4-6 schematically illustrate corresponding process steps for transferring a pattern from a template to a substrate, wherein radiation is applied through a transparent substrate to solidify a polymerisable fluid on the substrate surface.
Figure 5:
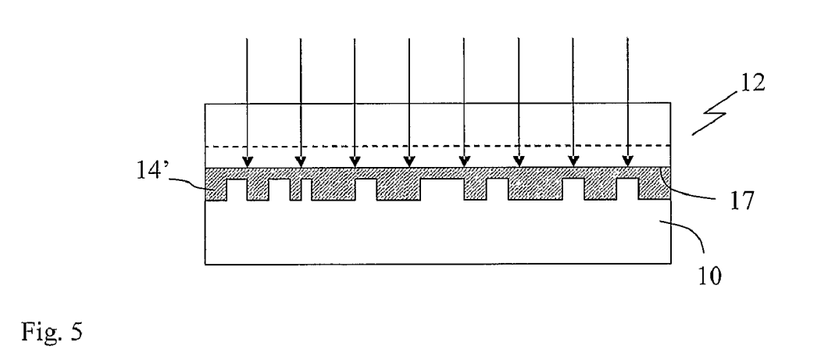
Figure 6:
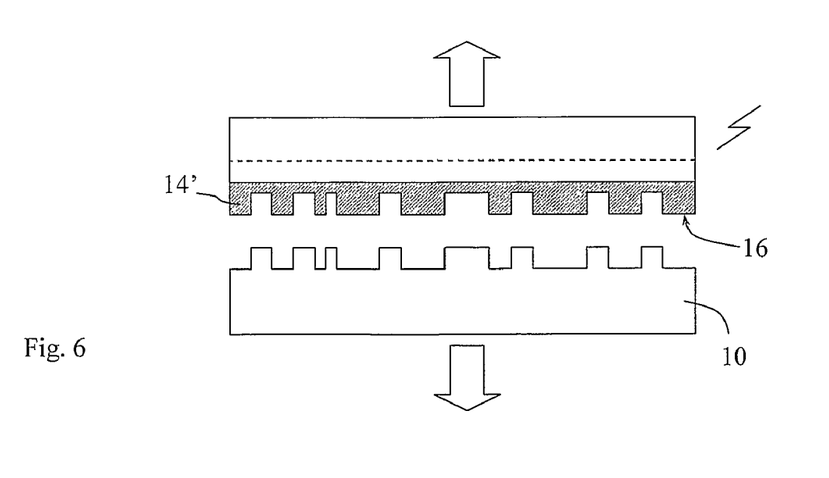

FIGS. 4-6 schematically present the basic process steps of the actual pattern transfer steps, or imprint steps, of an alternative embodiment of the invention. The only real difference from the embodiment of FIGS. 1-3 is that in this embodiment the radiation 19 is applied through substrate 12 instead of through template 10, while the same reference marks have been used. No further explanation of the features of FIGS. 4-6 will therefore be made. However, it should be noted that a combination of these two embodiments is possible, i.e. by applying radiation through both template 10 and substrate 12.

Figure 7:
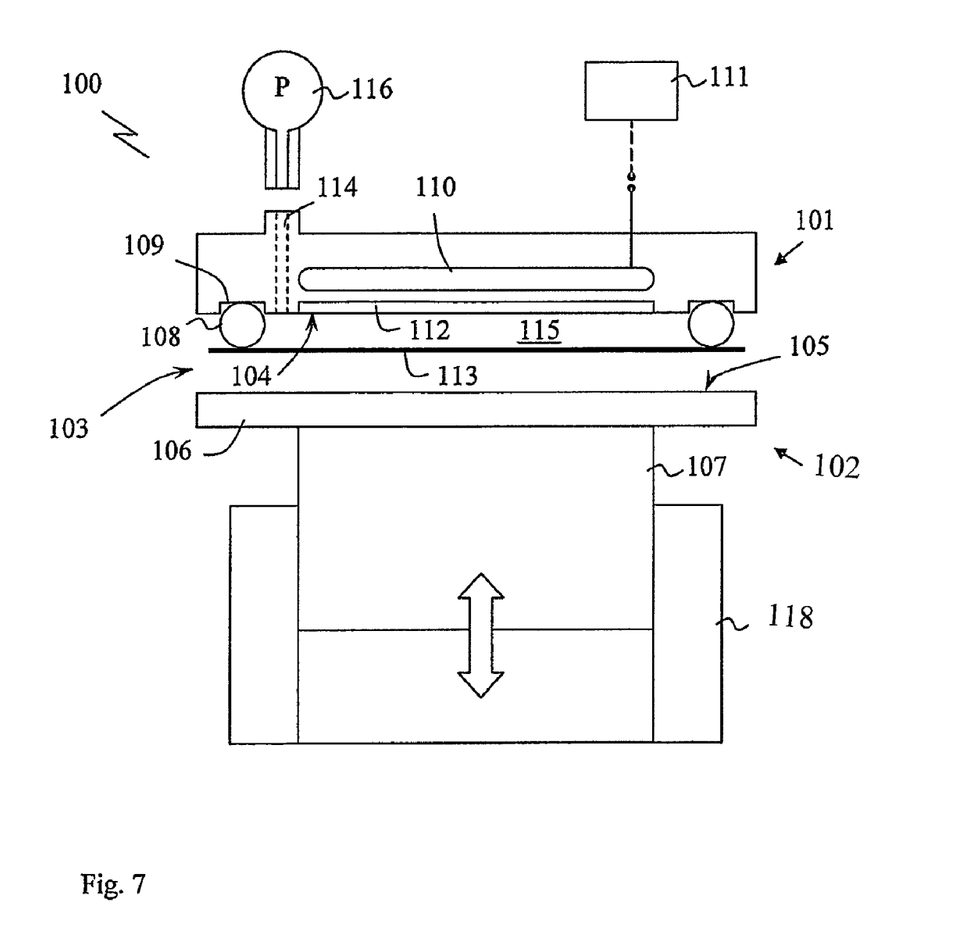
FIG. 7 schematically illustrates an embodiment of an apparatus according to the invention, for performing the process as generally described in FIGS. 1-3 or 4-6.

FIG. 7 schematically illustrates a preferred embodiment of an apparatus according to the present invention, also usable for carrying out an embodiment of the method according to the present invention. It should be noted that this drawing is purely schematic, for the purpose of clarifying the different features thereof. In particular, dimensions of the different features are not on a common scale.

The apparatus 100 comprises a first main part 101 and a second main part 102. In the illustrated preferred embodiment these main parts are arranged with the first main part 101 on top of second main part, with an adjustable spacing 103 between said main parts. When making a surface imprint by a process as illustrated in FIGS. 1-6, it may be of great importance that the template and the substrate are properly aligned in the lateral direction, typically called the X-Y plane. This is particularly important if the imprint is to be made on top of or adjacent to a previously existing pattern in the substrate. However, the specific problems of alignment, and different ways of overcoming them, are not addressed herein, but may of course be combined with the present invention when needed.

The first, upper, main part 101 has a downwards facing surface 104, and the second, lower, main part 102 has an upwards facing surface 105. Upwards facing surface 105 is, or has a portion that is, substantially flat, and which constitutes an upper surface of a plate 106 which acts as a support structure for a template or a substrate to be used in an imprint process, as will be more thoroughly described in conjunction with FIGS. 8 and 9. Means for adjusting spacing 103 are, in the illustrated embodiment, provided by a piston member 107 attached at its outer end to plate 106. Piston member 107 is displaceably linked to a cylinder member 118, which preferably is held in fixed relation to first main part 101. As is indicated by the arrow in the drawing, the means for adjusting spacing 103 are devised to displace second main part 102 closer to or farther from first main part 101, by means of a movement substantially perpendicular to the substantially flat surface 105, i.e. in the Z direction. Displacement may be achieved manually, but is preferably assisted by employing either a hydraulic or pneumatic arrangement. The illustrated embodiment may be varied in a number of ways in this respect, for instance by instead attaching plate 106 to a cylinder member about a fixed piston member. It should further be noted that the displacement of second main part 102 is mainly employed for loading and unloading the apparatus 100 with a template and a substrate, and for arranging the apparatus in an initial operation position. The movement of second main part 102 is, however, preferably not included in the actual imprint process as such in the illustrated embodiment, as will be described.

First main part 101 comprises a peripheral seal member 108, which encircles surface 104. Preferably, seal member 108 is an endless seal such as an o-ring, but may alternatively be composed of several interconnected seal members which together form a continuous seal 108. Seal member 108 is disposed in a recess 109 outwardly of surface 104, and is preferably detachable from said recess. The apparatus further comprises a radiation source 110, in the illustrated embodiment disposed in the first main part 101 behind surface 104. Radiation source 110 is connectable to a radiation source driver 111, which preferably comprises or is connected to a power source (not shown). Radiation source driver 111 may be included in the apparatus 100, or be an external connectable member. A surface portion 112 of surface 104, disposed adjacent to radiation source 110, is formed in a material which is transparent to radiation of a certain wavelength or wavelength range of radiation source 110. This way, radiation emitted from radiation source 110 is transmitted towards spacing 103 between first main part 101 and second main part 102, through said surface portion 112. Surface portion 112, acting as a window, may be formed in available fused silica, quartz, or glass used for CD/DVD mastering.

In operation, apparatus 100 is further provided with a flexible membrane 113, which is substantially flat and engages seal member 108. In a preferred embodiment, membrane 113 is a separate member from seal member 108, and is only engaged with seal member 108 by applying a counter pressure from surface 105 of plate 106, as will be explained. However, in an alternative embodiment, membrane 113 is attached to seal member 108, e.g. by means of a cement, or by being an integral part of seal member 108. Furthermore, in such an alternative embodiment, membrane 113 may be firmly attached to main part 101, whereas seal 108 is disposed outwardly of membrane 113. For an embodiment such as the one illustrated, also membrane 113 is formed in a material which is transparent to radiation of a certain wavelength or wavelength range of radiation source 110. This way, radiation emitted from radiation source 110 is transmitted into spacing 103 through said cavity 115 and its boundary walls 104 and 113. Examples of usable materials for membrane 113, for the embodiment of FIGS. 7-9, include polycarbonate, polypropylene, polyethylene. The thickness of membrane 113 may typically be 10-500 μm.

A conduit 114 is formed in first main part 101 for allowing a fluid medium to pass to a space defined by surface 104, seal member 108 and membrane 113, which space acts as a cavity 115 for said fluid medium. Conduit 114 is connectable to a pressure source 116, such as a pump, which may be an external or a built in part of apparatus 100. Pressure source 116 is devised to apply an adjustable pressure, in particular an overpressure, to a fluid medium contained in said cavity 115. An embodiment such as the one illustrated is suitable for use with a gaseous pressure medium. Preferably, said medium is selected from the group containing air, nitrogen, and argon. If instead a liquid medium is used, it is preferred to have the membrane attached to seal member 108. Such a liquid may be a hydraulic oil.

Figure 8:
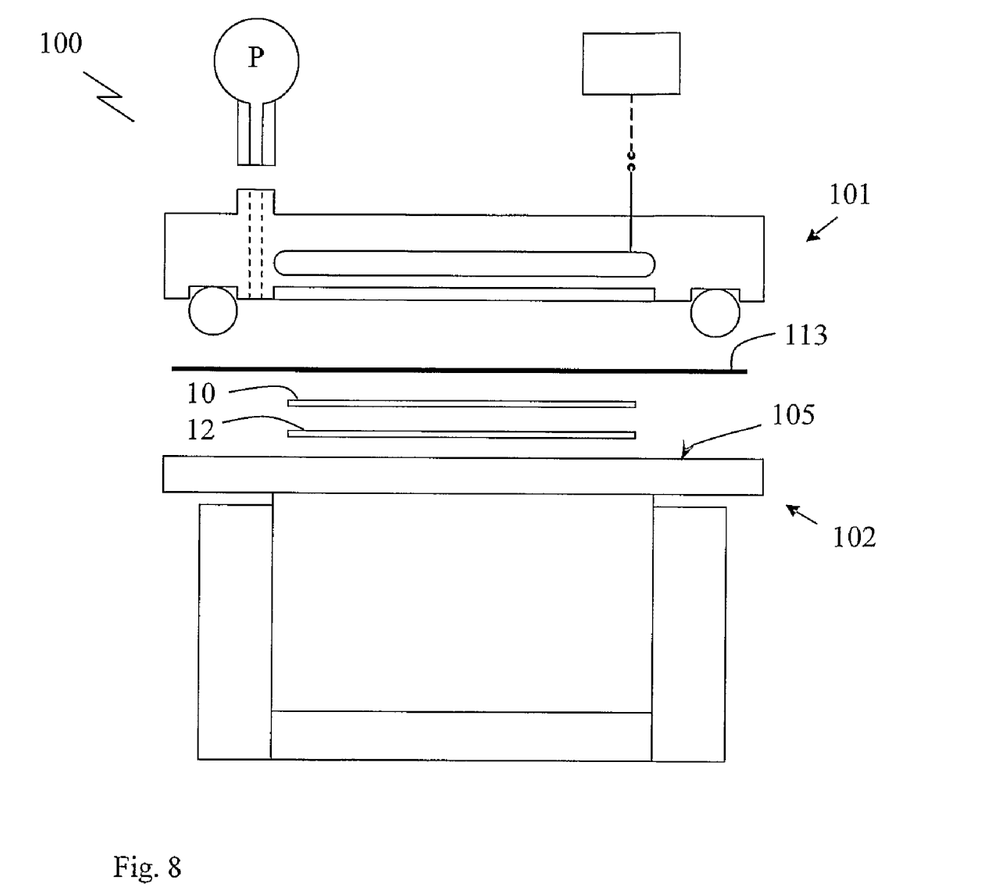
FIG. 8 schematically illustrates the apparatus of FIG. 7, when loaded with a template and a substrate at an initial step of the process.

FIG. 8 illustrates the apparatus embodiment of FIG. 7, when being loaded with a substrate and a template for a lithographic process. For better understanding of this drawing, reference is also made to FIGS. 1-3. Second main part 102 has been displaced downwards from first main part 101, for opening up spacing 103. As indicated in FIGS. 1-6, either the template or the substrate, or both, are transparent to radiation of a certain wavelength or wavelength range of radiation source 110. The illustrated embodiment of FIG. 8 shows an apparatus loaded with a transparent template 10 on top of a substrate 12. Substrate 12 is placed with a backside thereof on surface 105 of the second main part 102, thereby having its substrate surface 17 with the layer 14 of polymerisable fluid facing upwards. Template 10 is placed on or adjacent to substrate 12, with its structured surface 11 facing substrate 12. Means for aligning template 10 with substrate 12 may be provided, but are not illustrated in this schematic drawing. Membrane 113 is then placed on top of template 10. For an embodiment where membrane 113 is attached to the first main part, the step of actually placing membrane 113 on the template is, of course, dispensed with. In FIG. 8 template 10, substrate 12 and membrane 113 are shown completely separated for the sake of clarity only, whereas in a real situation they would be stacked on surface 105.

Figure 9:
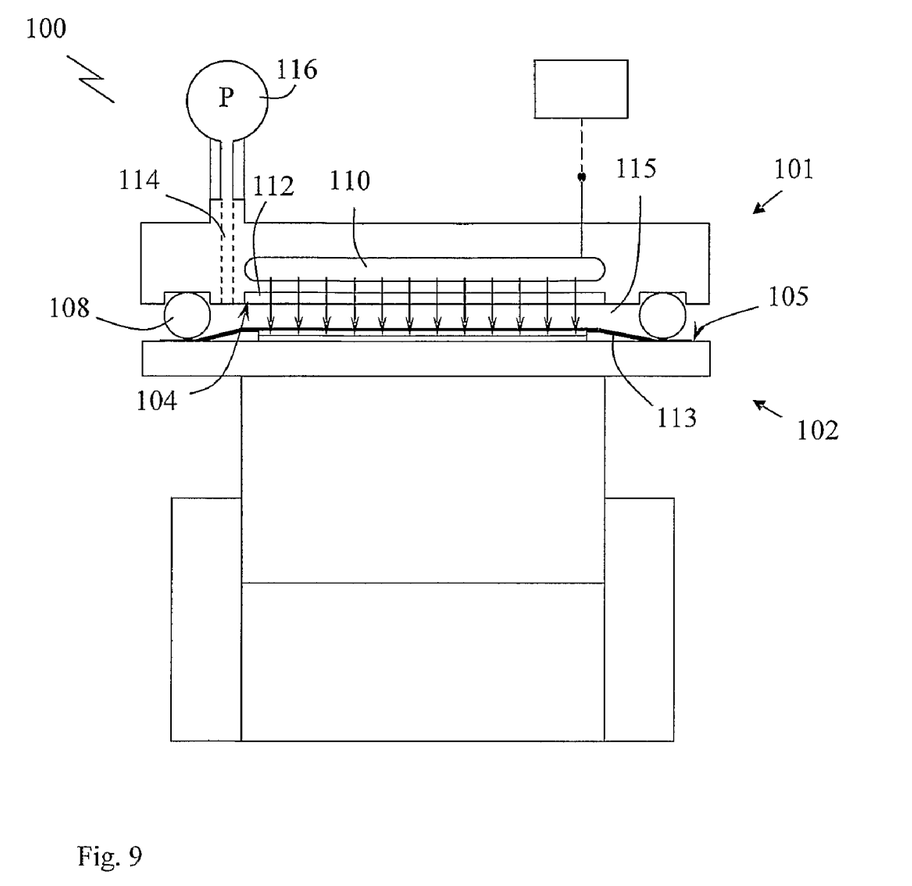
FIG. 9 illustrates the apparatus of FIGS. 7 and 8, at an active process step of transferring a pattern from the template to the substrate.

FIG. 9 illustrates an operative position of apparatus 100. Second main part 102 has been raised to a position where membrane 113 is clamped between seal member 108 and surface 105 of second main part 102. In reality, both template 10 and substrate 12 are very thin, typically only parts of a millimeter, and the actual bending of membrane 113 as illustrated is minimal. Still, surface 105 may optionally be devised with a raised peripheral portion at the point where it contacts seal member 108 through membrane 113, for compensating for the combined thickness of template 10 and substrate 12.

Once main parts 101 and 102 are engaged to clamp membrane 113, cavity 115 is sealed. Pressure source 116 is then devised to apply an overpressure to a fluid medium in cavity 115. The pressure in cavity 115 is transferred by membrane 113 to template 10, which is pressed towards substrate 12 for imprinting the template pattern in the polymerisable fluid layer 14, cf. FIG. 2. The pressure of the medium in cavity 115 is increased to 5-500 bar, advantageously to 5-200 bar, and preferably to 5-100 bar. Template 10 and substrate 12 are thereby being pressed together with a corresponding pressure. Thanks to flexible membrane 113, an absolutely even distribution of force is obtained over the whole of the contact surface between the substrate and the template. The template and the substrate are thereby made to arrange themselves absolutely parallel in relation to one another and, the influence of any irregularities in the surface of the substrate or template being eliminated.

When template 10 and substrate 12 have been brought together by means of the applied fluid medium pressure, radiation source is triggered to emit radiation 19. The radiation is transmitted through surface portion 112, which acts as a window, through cavity 115, membrane 113, and template 10. The radiation is partly or completely absorbed in the layer 14 of polymerisable fluid, which thereby is solidified in the perfectly parallel arrangement between template 10 and substrate 12, provided by the pressure and membrane assisted compression. Radiation exposure time is dependent on the type and amount of fluid in layer 14, the radiation wavelength combined with the type of fluid, and of the radiation power. The feature of solidifying such a polymerisable fluid is well known as such, and the relevant combinations of the mentioned parameters are likewise known to the skilled person. Once the fluid has solidified to form a layer 14', further exposure has no major effect. However, dependent on the type of polymerisable fluid, post-baking at an enhanced temperature of 150-160° C. may be necessitated for a time period of 0.5-1 hour. Following an exposure time under compression, depending on the choice of material and radiation, and dimensions of the polymerisable layer, the pressure in cavity 115 is reduced and the two main parts 101 and 102 are separated from one another. Substrate 12 and template 10 are thereafter separated from one another. After this, the substrate is subjected to further treatment according to what is previously known for imprint lithography.

Figure 10:
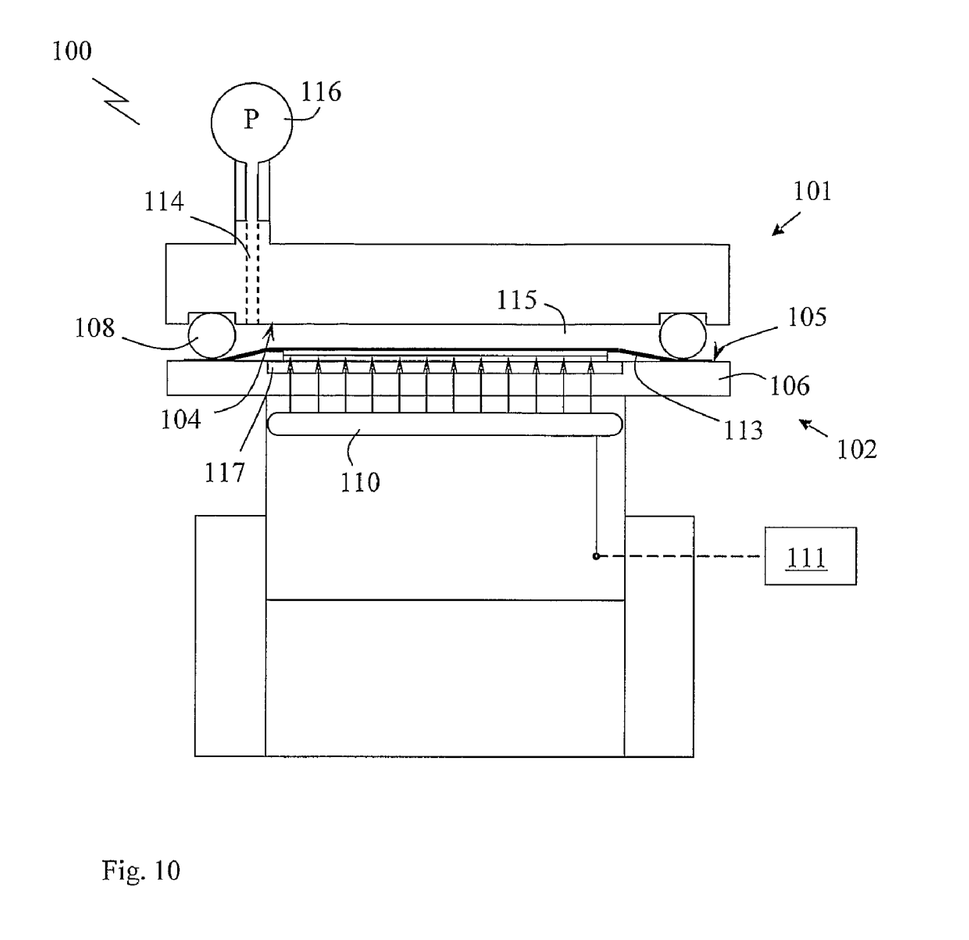
FIG. 10 illustrates an alternative embodiment, at an active process step of transferring a pattern from the template to the substrate corresponding to FIG. 9.

FIG. 10 illustrates an alternative embodiment of the invention, in an operative position similar to that of FIG. 9. Like elements have like references. In this alternative embodiment, radiation source 110 is instead disposed in second main part 102, behind surface 105. In such an embodiment, plate 106 is devised with a portion 117 of its upper surface 105 in a material which is transparent to radiation of a certain wavelength or wavelength range of radiation source 110, e.g. quartz, whereby radiation emitted from radiation source 110 is transmitted into spacing 103 between first main part 101 and second main part 102. Yet another alternative embodiment (not shown) is a combination of the two aforementioned, with radiation sources included in both the first main part 101 and in the second main part 102. In an embodiment such as shown in FIG. 10, membrane 113 need not be transparent to the polymerising radiation from radiation source 110. Therefore, this particular embodiment may employ a membrane 113 made from a thin sheet of metal, such as aluminium, e.g. with a thickness of 10-500 µm.

In a special embodiment of the invention, the upper member of template 10 or substrate 12, may also act as the membrane. In such an embodiment, separate membrane 113 is dispensed with. Instead, the uppermost member 10 or 12 is provided in a size that extends outwardly of seal member 108. Furthermore, said uppermost member 10 or 12 must also be flexible to sustain and transfer the pressure from cavity 115. Such an embodiment can typically be used when the substrate is a thin and flexible polymer film. The polymer substrate 12 is then placed on top of stamp 10 on surface 105.

One embodiment of the system according to the invention further comprises mechanical clamping means, for clamping together substrate 12 and template 10. This is particularly preferred in an embodiment with an external alignment system for aligning substrate and template prior to pattern transfer, where the aligned stack comprising the template and the substrate has to be transferred into the imprint apparatus. The system may also contain means for applying a vacuum between stamp and substrate in order to extract air inclusions from the polymerisable layer of the stacked sandwich prior to hardening of the polymerisable fluid through UV irradiation.

In a preferred embodiment, the template surface 11 is preferably treated with an anti-adhesion layer to prevent the cured polymer layer 14' from sticking to it after the imprint process. An example of such an anti-adhesion layer comprises a fluorine-containing group, as presented in WO 03/005124 and invented by one of the inventors of the instant invention. The contents of WO 03/005124 are also hereby incorporated by reference.

A first mode of the invention, with a transparent template, which has been successfully tested by the inventors, involves a substrate 12 of silicon covered by a layer 14 of NIP-K17 with a thickness of 1 µm. A template of glass or fused silica/quartz, with a thickness of 600 µm, has been used.

A second mode of the invention, with a transparent substrate, which has been successfully tested by the inventors, involves a substrate 12 of glass or fused silica/quartz covered by a layer 14 of NIP-K17 with a thickness of 1 µm. A template of e.g. nickel or silicon has been used, with a thickness of about 600 µm, though any other suitable non-transparent material can be used.

After compression by means of membrane 113 with a pressure of 5-100 bar for about 30 seconds, radiation source 110 is turned on. Radiation source 110 is typically devised to emit at least in the ultraviolet region below 400 nm. In a preferred embodiment, an air-cooled xenon lamp with an emission spectrum ranging from 200-1000 nm is employed as the radiation source 110. The preferred xenon type radiation source 110 provides a radiation of 1-10 W/cm$^2$, and is devised to flash 1-5 µs pulses, with a pulse rate of 1-5 pulses per second. A window 112 of quartz is formed in surface 104 for passing through radiation. Exposure time is preferably between 1-30 seconds, for polymerising fluid layer 14 into a solid layer 14'. After successful exposure, second main part 102 is lowered to a position similar to that of FIG. 8, following which template 10 and substrate 12 are removed from the apparatus for separation and further processing of the substrate.

The disclosed apparatus and method is particularly advantageous for large area imprint in a single step, and has as such huge benefits over the previously known step and flash method. Thanks to the membrane-transferred fluid pressure, the present invention can be used for one step imprint of substrates of 8 inch, 12 inch, and even larger discs. Even full flat panel displays with sizes of about 400×600 mm and larger can be patterned with a single imprint and exposure step with the present invention. The present invention therefore provides a technique which may for the first time make radiation-assisted polymerisation imprint attractive to large scale production. The invention is usable for forming patterns in a substrate for production of e.g. printed wire boards or circuit boards, electronic circuits, miniaturised mechanical or electromechanical structures, magnetic and optical storage media etc.

The invention is defined by the appended claims.

The invention claimed is:

1. Apparatus for transferring a pattern from a template having a structured surface to a substrate carrying a surface layer of a radiation polymerisable fluid, said apparatus comprising a first main part and a second main part having opposing surfaces, means for adjusting a spacing between said main parts, support means for supporting said template and substrate in mutual parallel engagement in said spacing with said structured surface facing said surface layer, a radiation source devised to emit radiation, for solidifying said layer, into said spacing, a flexible membrane configured to overlie both the template and the substrate, a cavity having a first wall, the first wall comprising the flexible membrane devised to engage either said template or said substrate, and means for applying an adjustable overpressure to a medium present in said cavity wherein said membrane is transparent to a wavelength range of said radiation, said radiation source being positioned behind said membrane, and said substrate being positioned outside of said pressurized cavity, and wherein said membrane is devised to transfer said overpressure to said template or to said substrate and thereby to arrange said template and said substrate in parallel relation to one another by obtaining an even distribution of force over the whole of a contact surface between the substrate and the template.

2. The apparatus as recited in claim 1, wherein said medium comprises a gas.

3. The apparatus as recited in claim 2, wherein said medium comprises air.

4. The apparatus as recited in claim 1, wherein said means for applying an adjustable overpressure is arranged to adjust the pressure to 1-500 bar.

5. The apparatus as recited in claim 1, wherein said cavity is defined by a part of the surface of said first main part, a flexible seal member arranged in and protruding from said first main part surface, and said membrane which engages said seal member.

6. The apparatus as recited in claim 5, wherein said membrane is disconnectable from said seal member, and devised to engage said seal member by application of pressure from said second main part.

7. The apparatus as recited in claim 5, wherein said membrane and at least a portion of said surface of said first main part is transparent to a wavelength range of said radiation, said radiation source being positioned behind said portion of said surface of said first main part.

8. The apparatus as recited in claim 7, wherein said portion of said surface of said first main part is made from quartz, calcium fluoride or any other pressure stable material being transparent to said radiation.

9. The apparatus as recited in claim 7, wherein said radiation source is devised to emit radiation at least in a wavelength range of 100-500 nm.

10. The apparatus as recited in claim 9, wherein said radiation source is devised to emit pulsating radiation with a pulse duration of 0.5-10 μs and a pulse rate of 1-10 pulses per second.

11. The apparatus as recited in claim 7, wherein said membrane consists of a polymer material.

12. The apparatus as recited in claim 7, wherein said membrane has a diameter or width of 50-1000 mm.

13. Method for transferring a pattern from a template having a structured surface to a substrate carrying a surface layer of a radiation polymerisable fluid using the apparatus of claim 1, comprising the steps of arranging said template and substrate mutually parallel with said structured surface facing said surface layer, between a stop member and a first side of a flexible membrane applying an overpressure to a medium present on a second side of the membrane, opposite to said first side, for imprinting said pattern into said layer;

exposing said layer to radiation for solidifying said surface layer;

emitting radiation to said surface layer through said membrane, which membrane is transparent to a wavelength range of a radiation usable for polymerising said fluid.

14. The method as recited in claim 13, wherein said medium comprises a gas.

15. The method as recited in claim 14, wherein said medium comprises air.

16. The method as recited in claim 13, comprising the step of:

placing said membrane in direct engagement with said template or said substrate.

17. The method as recited in claim 16, comprising the step of:

clamping said membrane at a peripheral portion thereof between said stop member and a seal member, thereby defining a peripheral wall for a cavity for said medium.

18. The method as recited in claim 13, comprising the step of:

emitting radiation to said layer through said membrane, and through a transparent wall opposing said membrane, defining a back wall for a cavity for said medium, which back wall and membrane are transparent to a wavelength range of a radiation usable for polymerising said fluid.

19. The method as recited in any of claim 13, wherein the step of exposing said layer comprises the step of:

emitting radiation from a radiation source within a wavelength range of 100-500 nm.

20. The method as recited in claim 19, comprising the steps of:

emitting pulsating radiation with a pulse duration in the range of 0.5-10 μs and a pulse rate in the range of 1-10 pulses per second.

21. The method as recited in claim 13, comprising the step of:

clamping said substrate and template together prior to arranging said template and substrate between said stop member and said flexible membrane.

22. The method as recited in claim 13, comprising the step of:

applying a vacuum between said template and said substrate in order to extract air inclusions from said surface layer prior to exposing said layer to radiation.

* * * * *